(12) United States Patent
Kuramoto

(10) Patent No.: US 9,502,610 B2
(45) Date of Patent: Nov. 22, 2016

(54) METHOD FOR MANUFACTURING LIGHT EMITTING DEVICE

(71) Applicant: NICHIA CORPORATION, Anan-shi, Tokushima (JP)

(72) Inventor: Masafumi Kuramoto, Tokushima (JP)

(73) Assignee: NICHIA CORPORATION, Anan-shi (JP)

( * ) Notice: Subject to any disclaimer, the term of this patent is extended or adjusted under 35 U.S.C. 154(b) by 0 days.

(21) Appl. No.: 14/933,208

(22) Filed: Nov. 5, 2015

(65) Prior Publication Data

US 2016/0133809 A1 May 12, 2016

(30) Foreign Application Priority Data

Nov. 7, 2014 (JP) .................................. 2014-226614

(51) Int. Cl.
| | |
|---|---|
| *H01L 21/44* | (2006.01) |
| *H01L 21/48* | (2006.01) |
| *H01L 21/50* | (2006.01) |
| *H01L 33/00* | (2010.01) |
| *H01L 33/56* | (2010.01) |

(52) U.S. Cl.
CPC ........... *H01L 33/0095* (2013.01); *H01L 33/56* (2013.01); *H01L 2224/83191* (2013.01); *H01L 2224/95* (2013.01); *H01L 2933/005* (2013.01); *H01L 2933/0066* (2013.01)

(58) Field of Classification Search
CPC . H01L 21/56; H01L 21/565; H01L 21/4825; H01L 21/02129; H01L 23/53242; H01L 23/53233; H01L 23/3114; H01L 23/345; H01L 23/4952; H01L 23/315; H01L 27/0814; H01L 29/6603; H01L 51/5296; H01L 51/0034; H01L 33/52

USPC ......... 438/91, 106, 123, 126, 127, 328, 602, 438/780; 257/E21.006, E21.007, E21.053, 257/E21.077, E21.352, E21.126, E21.127, 257/E21.366

See application file for complete search history.

(56) References Cited

U.S. PATENT DOCUMENTS

| 8,193,014 B2 * | 6/2012 | Horiuchi ............. H01L 21/6836 438/28 |
|---|---|---|
| 9,184,349 B2 * | 11/2015 | Jeong ...................... H01L 33/44 |
| 9,287,472 B2 * | 3/2016 | Miki ....................... H01L 33/56 |
| 2010/0190280 A1 | 7/2010 | Horiuchi |
| 2015/0001563 A1 | 1/2015 | Miki |
| 2015/0050760 A1 | 2/2015 | Imazu et al. |

FOREIGN PATENT DOCUMENTS

| JP | 2010-199565 A | 9/2010 |
|---|---|---|
| JP | 2012-124358 A | 6/2012 |
| JP | 2013-140894 A | 7/2013 |
| JP | 2015-012081 A | 1/2015 |
| WO | 2013-137356 A1 | 9/2013 |

* cited by examiner

*Primary Examiner* — David Nhu
(74) *Attorney, Agent, or Firm* — Global IP Counselors, LLP

(57) ABSTRACT

A method for manufacturing a light emitting device, includes a first step of mounting a light emitting element on a support base with a bump; and a second step of clamping the support base and the light emitting element and pressing between a lower molding die and an upper molding die to plastically deform the bump, and injecting the compound of a cover member into a mold cavity between the lower molding die and the upper molding die and curing the compound to form the cover member that covers at least a lower surface of the light emitting element after the first step.

20 Claims, 3 Drawing Sheets

METHOD FOR MANUFACTURING LIGHT EMITTING DEVICE

CROSS-REFERENCE TO RELATED APPLICATIONS

This application claims priority to Japanese Patent Application No. 2014-226614 filed on Nov. 7, 2014. The entire disclosure of Japanese Patent Application No. 2014-226614 is hereby incorporated herein by reference.

BACKGROUND

1. Field of the Invention

The present disclosure relates to a method for manufacturing a light emitting device.

2. Description of Related Art

JP2013-140894A, for example, discusses a method for manufacturing an LED device, comprising an LED die mounting step by flip-chip mounting method of LED dies on a lead frame, a sheet affixation step of affixing a large sized first pressure-sensitive adhesive sheet and second pressure-sensitive adhesive sheet on the top surface side of the LED die and the rear surface side of the lead frame, a white member injection step of filling a reflective white member on the inside of the first pressure-sensitive adhesive sheet and second pressure-sensitive adhesive sheet, and a separation step of cutting up the reflective white member and separating it into LED devices.

SUMMARY

An object of the present disclosure is to provide a method for manufacturing light emitting devices with little variance in the orientation of the light emitting element among devices.

The method for manufacturing a light emitting device of the present disclosure includes a first step of mounting a light emitting element on a support base with a bump; and a second step of clamping the support base and the light emitting element and pressing between a lower molding die and an upper molding die to plastically deform the bump, and injecting the compound of a cover member into a mold cavity between the lower molding die and the upper molding die and curing the compound to form the cover member that covers at least a lower surface of the light emitting element after the first step.

Also another method for manufacturing a light emitting device of the present disclosure includes a first step of mounting a plurality of light emitting elements on a support base with bumps; and a second step of clamping the support base and the plurality of light emitting elements and pressing between a lower molding die and an upper molding die to plastically deform at least one of the bumps, and injecting the compound of a cover member into a mold cavity between the lower molding die and the upper molding die and curing the compound to form the cover member that covers at least a lower surface of the light emitting element after the first step.

The present disclosure provides a method for manufacturing light emitting devices with little variance in the orientation of the light emitting element among devices.

DETAILED DESCRIPTION OF THE EMBODIMENT

Embodiments for implementing the light emitting device and the method for manufacturing thereof of the present invention will be described below with reference to the accompanying drawings. In the following embodiment, the light emitting device and the method for manufacturing thereof that embody the technological concept of the present invention are just examples, and unless otherwise specified, the constituent parts discussed in the embodiments are not intended to limit the scope of the present invention. Further, constitutions described in examples and the embodiments can be employed in other examples and embodiments.

The sizes and the arrangement relationships of the members in each of drawings are occasionally shown exaggerated for ease of explanation.

Embodiment 1

FIGS. 1A to 1E are schematic manufacturing step diagrams showing the method for manufacturing the light emitting device according to an Embodiment 1. A light emitting device 100 is a chip-size package (CSP) type-light emitting diode (LED). The light emitting device 100 is manufactured through at least the following first and second steps. This embodiment further includes a step of forming a light-transparent member 50 (third step) and a separation step, but this is just a preferred example, and these additional steps can also be omitted.

First Step

Figure 1A:
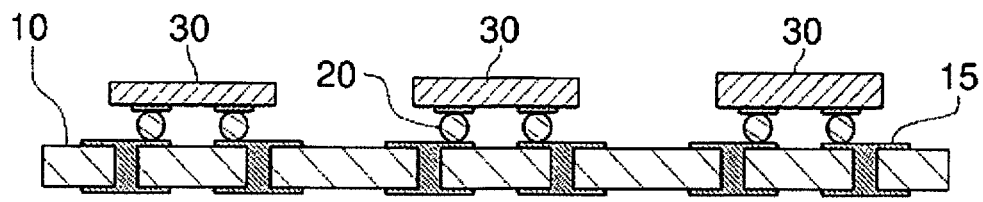
FIGS. 1A to 1E are schematic manufacturing step diagrams showing a method for manufacturing the light emitting device according to an embodiment of the present invention.

First, as shown in FIG. 1A, light emitting elements 30 are mounted on a support base 10 with bumps 20. At least two of the bumps 20 here are provided to each light emitting element 30, corresponding to the positive and negative electrode pairs provided to the lower surface side of the light emitting elements 30. A plurality of the bumps 20 may also be provided corresponding to a single positive or negative electrode.

Second Step

Figure 1B:
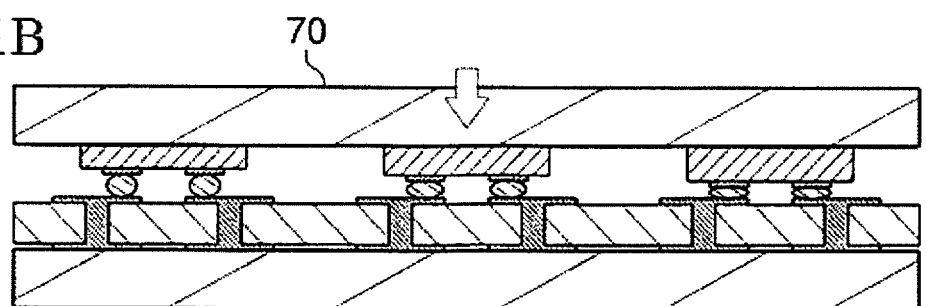
Figure 1C:
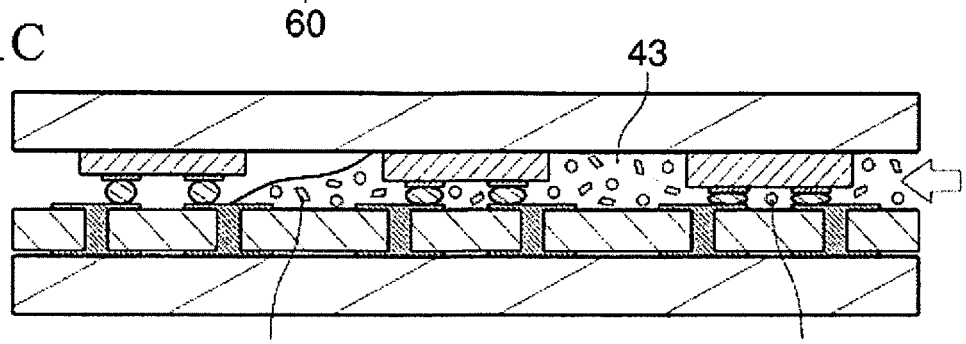

Next, following the first step, a cover member 40 is formed to cover at least the lower surfaces of the light emitting elements 30, and preferably the lower surfaces and the side surfaces of the light emitting elements 30. This second step includes plastically deforming the bumps 20 by clamping and pressing the support base 10 and the light emitting elements 30 between a lower molding die 60 and an upper molding die 70 as shown in FIG. 1B, and injecting and curing the compound 43 of the cover member in the mold cavity between the lower molding die 60 and the upper molding die 70 (here, the support base 10 and the upper molding die 70) as shown in FIG. 1C.

Third Step

Figure 1D:
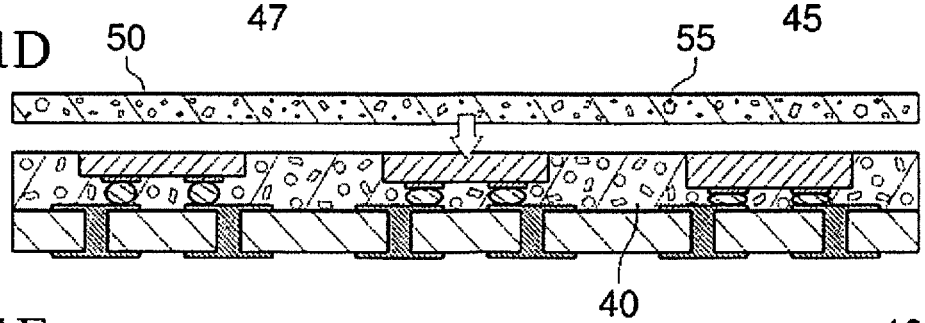

Next, as shown in FIG. 1D, the light-transparent member 50 is formed on the light emitting elements 30. The light-transparent member 50 here is in the form of a sheet or a plate, and is formed by bonding to the upper surfaces of the cover member 40 and the light emitting elements 30. The light-transparent member 50 preferably contains a phosphor 55, but this is not required.

Figure 1E:
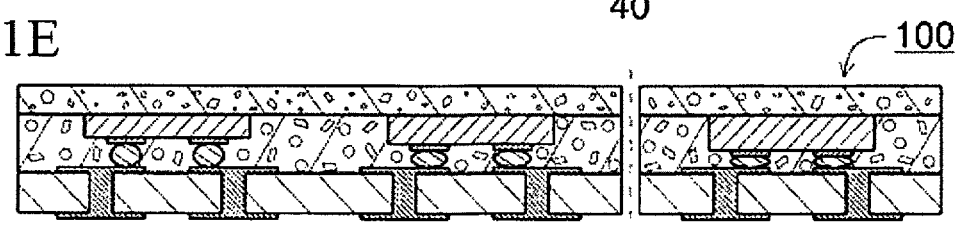

Finally, as shown in FIG. 1E, the light emitting device 100 is obtained.

With the above method for manufacturing the light emitting device 100, plastic deformation of the bumps 20 can be utilized to adjust the orientation of the light emitting elements 30 in devices using the molding die. Also, the orientation of the light emitting elements 30 can be simply adjusted, and the number of process steps may be reduced, by using the same molding die for the plastically deformation of the bumps 20 and the formation of the cover member 40. This leads to allow light emitting devices to be manufactured which have little variance in the orientation of the light emitting elements 30 among devices. Consequently, variance in the light distribution characteristics (luminance distribution and color distribution) of the light emitting device can be reduced. Furthermore, variance in the height of the upper surfaces of the light emitting elements 30 among devices can be reduced, so that it can reduce variance in the thickness of the light emitting devices. Also, unintentional covering of the upper surfaces of the light emitting elements 30 by the cover member 40 can be reduced or prevented, while the side surfaces of the light emitting elements 30 can be readily covered by the cover member 40 up to the height of the upper surfaces, so high emission efficiency can be ensured in the light emitting devices.

In Embodiment 1, the first step involves mounting a plurality of the light emitting elements 30 on the support base 10 with the bumps 20. The second step involves forming the cover member 40 to cover at least the lower surfaces of the light emitting elements 30. The second step includes plastically deforming at least one of the bumps 20 by clamping and pressing the support base 10 and the light emitting elements 30 between the lower molding die 60 and the upper molding die 70, and injecting and curing the compound 43 of the cover member in the mold cavity between the lower molding die 60 and the upper molding die 70. In this way, thus performing the orientation in devices simultaneously and with the same mold for the light emitting elements 30 makes the work more efficient and tends to reduce variance in the orientation of the light emitting elements 30 among devices. Also, even when a plurality of light emitting elements 30 of different thickness are used, variance in the height of the upper surfaces of the light emitting elements 30 among devices can be reduced, and this in turn allows variance in the thickness of the light emitting devices to be reduced. Also, even when a plurality of light emitting elements 30 of different thickness are used, unintentional covering of the upper surfaces of the light emitting elements 30 by the cover member 40 can be reduced or prevented, while the side surfaces of the light emitting elements 30 can be readily covered by the cover member 40 up to the height of the upper surfaces, so high emission efficiency can be ensured in the light emitting devices. This is reflected in the fact that the upper surfaces of the plurality of light emitting elements 30 and of the surrounding cover member 40 are flush, that is, form a single flat surface, after the second step, as shown in FIG. 1D and FIG. 2D (discussed below).

Also, in Embodiment 1, finally the composite including the support base 10, the bumps 20, the light emitting elements 30, the cover member 40 and the light-transparent member 50 is cut into fragmented light emitting devices 100 (separation step). There are no particular restrictions on the cutting position on the composite here, and as shown in FIG. 1E, a single light emitting device 100 may include just one light emitting element 30 or may include a plurality of light emitting elements 30.

The "orientation" of the light emitting elements in the light emitting device refers at least to "inclination" and may further encompass the meaning of "height (sticking up or sunken down)." The reference for this "orientation" can be the mounting-side main surface of the light emitting device (the lower surface here) or the upper surface of the support base 10 (a wiring board).

Preferred embodiments of manufacturing method of the light emitting device 100 are described below.

In the second step, the compound 43 of the cover member preferably contains an inorganic filler 45 to bring the coefficient of thermal expansion of the cover member 40 closer to the coefficient of thermal expansion of the bumps 20. Furthermore, the compound 43 of the cover member preferably contains a white pigment 47 in order to add optical reflectivity to the cover member 40. Silica can be used to particular advantage as the filler 45 because of its relatively low coefficient of thermal expansion. Also, titanium oxide can also be used favorably as the white pigment 47 because of its relatively high refractive index and its good light blocking property.

Here, using, for example, a modified silicone resin (coefficient of thermal expansion of 70 ppm, specific gravity of 1.05) for the base material of the cover member 40, silica (such as fused silica; coefficient of thermal expansion of 0.5 ppm, specific gravity of 2.2) for the filler 45, and titanium oxide (coefficient of thermal expansion of 8.57 ppm, specific gravity of 4.27) for the white pigment 47, and taking into account that the coefficient of thermal expansion of the cover member 40 is set to 20 ppm, the cover member 40 has a filler-rich composition in which the amount of base material is 29 wt %, the amount of filler 45 is 41 wt %, and the amount of white pigment 47 is 30 wt %, for example. The term "wt %" here means weight percent, and represents the ratio of the weight of the various materials to the total weight of the compound 43 of the cover member (or the cover member 40).

From the standpoint of the optical reflectivity of the cover member 40, the amount in which the white pigment 47 is contained in the cover member 40 is preferably greater, but since the particle size of the white pigment 47 is generally sub-micron size (0.1 µm to 0.5 µm, for example), and tends to affect the fluidity of the compound 43 of the cover member, the content is preferably at least 10 wt % and no more than 60 wt %, and more preferably at least 30 wt % and no more than 50 wt %. From the standpoint of ease of filling ability for directly spaces under the light emitting elements 30, the particle size of the filler 45 is preferably smaller, but when the above-mentioned content of the white pigment 47 is also taken into account, the lower limit at which the fluidity of the compound 43 of the cover member can be guaranteed is believed to be about 5 µm. From the standpoint of heat dissipation from the light emitting element, the upper limit to the particle size of the filler 45 is preferably no more than 100 µm, for example, and more preferably no more than 30 µm. The amount in which the filler 45 is contained in the cover member 40 may be suitably determined so that the coefficient of thermal expansion of the cover member 40 approximates the coefficient of thermal expansion of the bumps 20 (such as a differential in coefficient of thermal expansion (based on the bumps 20) of no more than 40%), but is preferably at least 30 wt % and no more than 80 wt %, for example, and more preferably at least 40 wt % and no more than 60 wt %.

Because of the above, the spacing between the upper surface of the support base 10 and the lower surfaces of the light emitting elements 30 is preferably at least 5 µm in order to ensure high filling ability of the filler 45 at the sites of the cover member 40 located the directly spaces under the light emitting elements 30. Specifically, in the second step, the support base 10 and the plurality of light emitting elements 30 are preferably clamped and pressed between the lower molding die 60 and the upper molding die 70 so as to satisfy $t_C \geq 5$ μm $(t_D+6\sigma)+t_S+t_B$. Here, $t_C$ is the spacing between the (lower surface of the) upper molding die 60 and the (upper surface of the) lower molding die 70 at the sites where the plurality of light emitting elements 30 are clamped. $t_D$ is the average thickness of the plurality of light emitting elements 30. $\sigma$ is the standard deviation of thickness of the plurality of light emitting elements 30. $t_S$ is the thickness of the support base 10. $t_B$ is the thickness of a cushioning member (a cushioning member 80, discussed below) when said cushioning member is provided between the lower molding die 60 and the support base 10 and/or between the upper molding die 70 and the light emitting elements 30. This ensures good filling ability of the filler 45 at the sites of the cover member 40 located the directly spaces under the light emitting elements 30. There are no particular restrictions on the upper limit to the spacing between the upper surface of the support base 10 and the lower surfaces of the light emitting elements 30, and it may be suitably determined according to the desired thickness of the light emitting device.

In the first step, the bumps 20 are preferably formed by a metal material with good ductility (called a ductile metal). More specifically, examples include gold, silver, copper, tin, platinum, zinc, nickel, and alloys thereof, and preferably gold, silver, copper, tin, zinc and alloys thereof. Of these, gold has the best ductility of all metals, is chemically stable, undergoes little surface oxidation, and is easy to bond, so gold or a gold alloy is particularly favorable. Also, copper has good thermal conductivity and is relatively inexpensive, so copper or a copper alloy is also preferable. When the bumps 20 are formed by such a metal or alloy that is relatively soft, the plastic deformation of the bumps 20 will be easier, and the orientation of the light emitting elements 30 will be easier to make uniform in devices. Also, there will be less damage to the light emitting elements 30 caused by pressing from the molding die.

In case where the support base 10 is a wiring board that has wiring 15, in the first or second step, the support base 10 and the light emitting elements 30 are preferably clamped and pressed between the lower molding die 60 and the upper molding die 70 to bond the light emitting elements 30 to the wiring 15 with the bumps 20. Consequently, in addition to forming the cover member 40 and adjusting the orientation of the light emitting elements 30, the electrical connection of the light emitting elements 30 to the wiring 15 can also be performed using the same mold, which is simpler. Also, in case where the light emitting elements 30 have already been bonded in the first step to the wiring 15 with the bumps 20, then in the second step a metal interdiffusion proceeds further between the bumps 20 and the wiring 15, which improves the bonding strength between the bumps 20 and the wiring 15. Furthermore, in case where the support base 10 is a lead frame, then in the first or second step, it is similarly preferable that the support base 10 and the light emitting elements 30 are clamped and pressed between the lower molding die 60 and the upper molding die 70 to bond the light emitting elements 30 to the lead frame with the bumps 20.

In the second step, there are no particular restrictions on the order of the stage of clamping and pressing the support base 10 and the light emitting elements 30 between the lower molding die 60 and the upper molding die 70 to plastically deform the bumps 20, and the stage of injecting and curing the compound 43 of the cover member in the mold cavity between the lower molding die 60 and the upper molding die 70. These stages can also proceed simultaneously. As shown in FIGS. 1B and 1C, however, it is preferable for the compound 43 of the cover member to be injected and cured in the mold cavity between the lower molding die 60 and the upper molding die 70 after the bumps 20 have been plastically deformed by clamping and pressing the support base 10 and the light emitting elements 30 with the lower molding die 60 and the upper molding die 70. This is because the viscosity of the compound 43 of the cover member varies with the preheating of the molding die, so the orientation of the light emitting elements 30 can be precisely made uniform, and distortion within the cover member 40 can be suppressed, by ending the adjustment of the orientation of the light emitting elements 30 first. This is also preferable in terms of reducing or preventing unintentional coverage of the upper surfaces of the light emitting elements 30 by the cover member 40.

In the stage of plastically deforming the bumps 20 by clamping and pressing the support base 10 and the light emitting elements 30 with the lower molding die 60 and the upper molding die 70 in the second step, the temperature of the molding die (the lower molding die 60 and the upper molding die 70) is preferably above the brittle-ductile transition temperature of the metal material constituting the bumps 20 in order to suppress the fracturing of the bumps 20. As a specific example, the temperature is preferably normal temperature or higher (5 to 35° C.).

Embodiment 2

FIGS. 2A to 2E are schematic manufacturing step diagrams showing the method for manufacturing the light emitting device according to Embodiment 2. In the method for manufacturing a light emitting device 200 in the Embodiment shown in FIGS. 2A to 2E, which correspond to that shown in FIGS. 1A to 1E respectively, those components that are substantially the same as in Embodiment 1 above will be numbered the same and may not be described again.

Figure 2A:
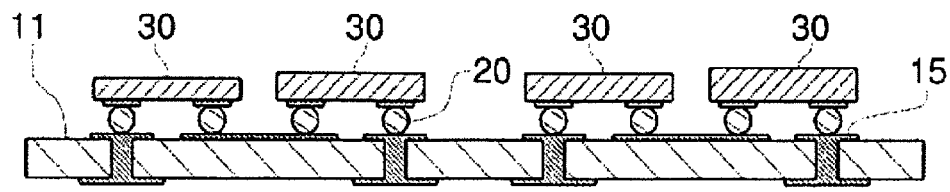
FIGS. 2A to 2E are schematic manufacturing step diagrams showing a method for manufacturing the light emitting device according to anther embodiment of the present invention.
Figure 2B:
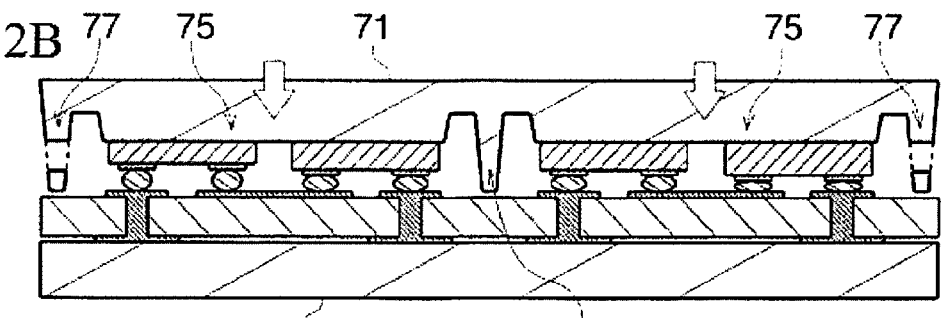
Figure 2C:
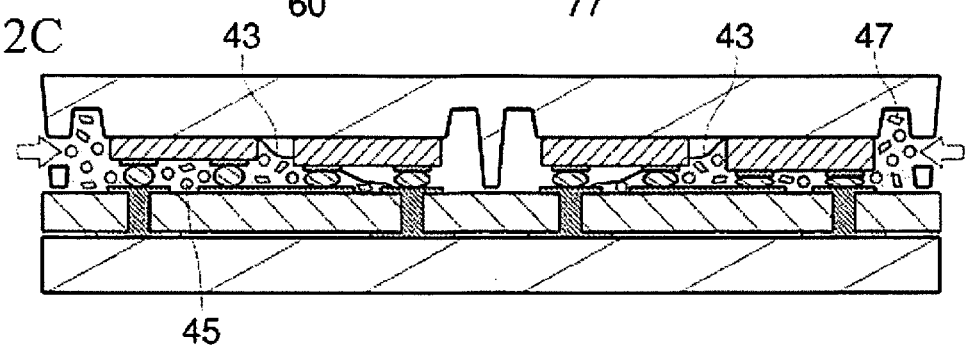
Figure 2D:
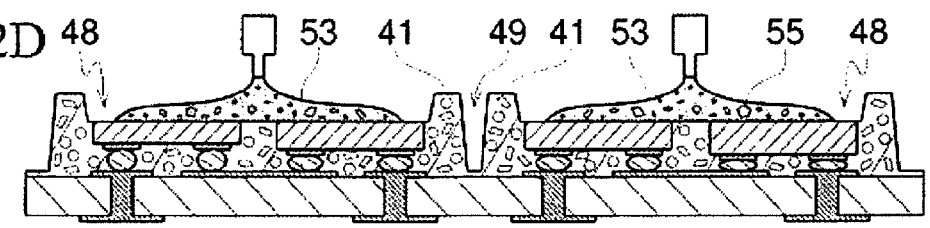
Figure 2E:
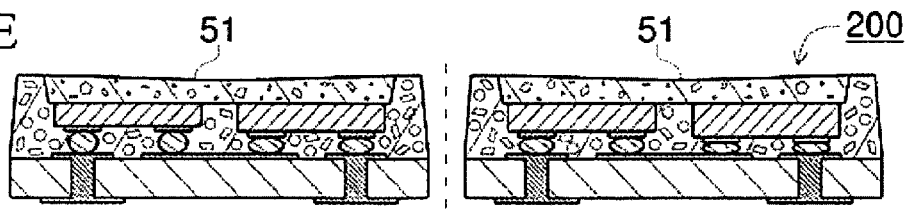

As shown in FIGS. 2B and 2C, in Embodiment 2, an upper molding die 71 has convex portions 75 located directly over and spanning the light emitting elements 30. As shown in FIG. 2D, in the second step, these convex portions 75 form first recess portions 48 in a cover member 41 that include on their bottom surfaces the upper surfaces of the light emitting elements 30. Consequently, the formation of window portions (light extraction portions) in the light emitting device by the cover member 41, and the adjustment of the orientation of the light emitting elements 30 in devices can be performed using the same molding die.

In particular, the convex portions 75 in the second embodiment are provided directly over and spanning the light emitting elements 30. In the second step, these convex portions 75 form the first recess portions 48 in the cover member 41 that include on their bottom surfaces the upper surfaces of the light emitting elements 30. Consequently, the formation of window portions (light extraction portions) in the light emitting device 200 spanning the light emitting elements 30, and the adjustment of the orientation of the light emitting elements 30 in devices can be performed using the same molding die, which is simpler. Also, this is preferable in the manufacture of the light emitting device 200 in which the plurality of light emitting elements 30 are optically linked to a single light-transparent member 51.

The parts of the cover member 41 located around the outer periphery of the first recess portions 48 (hereinafter referred to as "wall portions") function as light reflectors, while the openings in the first recess portions 48 function as window portions of the light emitting device 200. Thus, the light distribution of the light emitting device 200 can be adjusted by varying the shape of the first recess portions 48. The (side surfaces and/or edges of the) wall portions of the cover member 41 also function as barriers to hold back the compound 53 of the light-transparent member (discussed below). Thus, the light-transparent member 51 can be formed by a simple method such as potting or screen printing, for example. Also, the surface of the light-transparent member 51 need not be a flat surface (this encompasses a slightly concave surface that results from curing shrinkage), and may be formed as a convex shape, taking advantage of the surface tension of the compound 53 of the light-transparent member.

When a single convex portion 75 presses on a single light emitting element 30, the convex portion 75 is preferably provided so that the center of its lower surface coincides with the center of the upper surface of the light emitting element 30. In case where a single convex portion 75 presses on a plurality of light emitting elements 30 (as can be surmised from the cross sections in FIGS. 2B and 2C), the convex portion 75 is preferably provided so that the center of its lower surface coincides with the center of a region defined by linking the profile lines on the outside of the upper surfaces of the light emitting elements 30. Consequently, the pressing force of the convex portion 75 tends to be spread uniformly over the entire light emitting element 30, and it is easier to adjust the orientation of the light emitting elements 30 to an orientation with a smaller inclination in devices.

Also, in case where a single convex portion 75 presses on a single light emitting element 30, the convex portion 75 is preferably provided so that the entire upper surface of the light emitting element 30 is on the inside of the profile line of the lower surface of the convex portion 75 in top view (plan view). Also, in case where a single convex portion 75 presses on a plurality of light emitting elements 30 (as can be surmised from the cross sections in FIGS. 2B and 2C), the convex portion 75 is preferably provided so that the entire region defined by linking the outside lines out of the profile lines of the upper surfaces of the light emitting elements 30. Consequently, the pressing force of the convex portion 75 tends to be spread uniformly over the entire light emitting element 30, and it is easier to adjust the orientation of the light emitting elements 30 to an orientation with a smaller inclination in devices. On the other hand, the following may be done for the purpose of making the window portions of the light emitting device 200 relatively small. In case where a single convex portion 75 presses on a single light emitting element 30, the convex portion 75 may be provided so that the entire lower surface of the convex portion 75 is located on the inside of the profile of the upper surface of the light emitting element 30 in top view (plan view). Also, in case where a single convex portion 75 presses on a plurality of light emitting elements 30, the convex portion 75 may be provided so that its entire lower surface is located on the inside of a region defined by linking the outside lines out of the profile lines of the upper surfaces of the light emitting elements 30 in top view (plan view).

The upper molding die 71 may have just one convex portion 75, but preferably has a plurality of convex portions 75 as shown in FIGS. 2B and 2C. Consequently, the formation of window portions (light extraction portions) in the light emitting device 200 by the cover member 41, and the adjustment of the orientation of the light emitting elements 30 in devices can be performed at the same time and using the same mold, so the work can be performed more efficiently and there will tend to be less variance in the orientation of the light emitting elements 30 among devices. Also, as shown in FIGS. 2B and 2C, the lower surfaces of a plurality of the convex portions 75 (and preferably all of them) preferably lie in the same plane, in order to have a consistent height of the upper surfaces of the light emitting elements 30 in the various light emitting devices 200. However, the lower surfaces of the convex portions 75 may lie in planes of mutually different heights (positions in the thickness direction), in order to intentionally vary the height of the upper surfaces of the light emitting elements 30 in the various light emitting devices 200.

As shown in FIGS. 2B and 2C, the side surfaces of the convex portions 75 are preferably inclined to the outside with respect to the lower surfaces of the convex portions 75 by more than 90° and no more than 160°, and more preferably by at least 100° and no more than 135° (as the angle on the inside of the convex portions 75). This makes it easier to remove the upper molding die 71 after the molding of the cover member 41, and reduces or prevents damage to the wall portions of the cover member 41. Also, as shown in FIG. 2D, the side surfaces of the first recess portions 48 are inclined outward with respect to the bottom surfaces so that the opening diameter on the upper side of the first recess portions 48 becomes larger, so this tends to improve the light extraction efficiency of the light emitting device 200. The inclination referred to here encompasses not only a case in which the side surfaces of the first recess portions 48 are planar, but also a case in which they are curved surfaces (the inclination angle is considered to be a tangent plane or a tangent line in a cross section).

As shown in FIGS. 2B and 2C, in Embodiment 2, the upper molding die 71 has divider portions 77 that surround a specific number of the plurality of light emitting elements 30. As shown in FIG. 2D, in the second step, these divider portions 77 form second recess portions 49 that surround a specific number of light emitting elements 30. Consequently, the light emitting devices are formed in a state of being partitioned off to a certain extent by the second recess portions 49 (a state in which the bottom surfaces of the second recess portions 49 are the cover member 41), or of being separated (a state in which the bottom surfaces of the second recess portions 49 are a support base 11). Therefore, the light emitting devices can be cut with less cutting of the cover member 41, and fewer man-hours will be entailed by the separation step. Furthermore, the divider portions 77 can be used as a mask to form the cover member 41 while avoiding part of the wiring 15 that is on the upper surface of the support base 11, and part of the wiring 15 exposed from the cover member 41 can serve as external connection terminals. The side surfaces of the divider portions 77 are similar to the above-mentioned side surfaces of the convex portions 75 in that they are preferably inclined outward with respect to the lower surfaces of the divider portions 77. This causes the outer surface of the cover member 41 to be inclined inward so that the upper surface of the light emitting device 200 is narrower in width than its lower surface, so a smaller light emitting device 200 can be formed.

Furthermore, as shown in FIG. 2D, in Embodiment 2, there is a third step of forming the light-transparent member 51 in the first recess portions 48. The light-transparent member 51 is formed by filling the inside of the first recess portions 48 with the compound 53 of the light-transparent member, and the curing by heating, etc. The light-transparent member 51 preferably contains a phosphor 55, but need not contain a phosphor 55.

Embodiment 3

FIGS. 3A to 3E are schematic manufacturing step diagrams showing the method for manufacturing the light emitting device according to Embodiment 3. In the method for manufacturing a light emitting device 300 in the Embodiment shown in FIGS. 3A to 3E, which correspond to that shown in FIGS. 1A to 1E respectively, those components that are substantially the same as in Embodiment 1 above will be numbered the same and may not be described again.

Figure 3A:
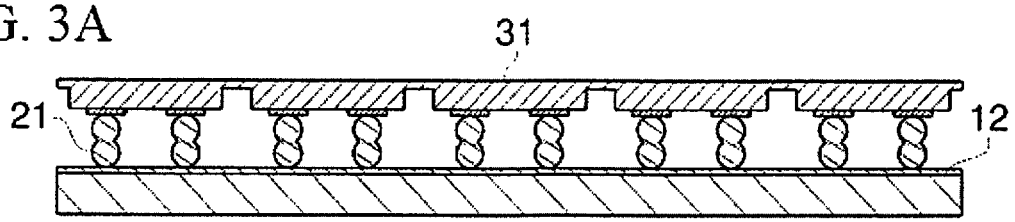
FIGS. 3A to 3E are schematic manufacturing step diagrams showing a method for manufacturing the light emitting device according to still another embodiment of the present invention.

As shown in FIG. 3A, in Embodiment 3, in the first step, bumps 21 are configured as multi-stage stud bumps. This allows for a greater adjustment margin of the thickness of the bumps 21 by the pressing of the mold. It also allows the light emitting elements 31 to be leveled. This facilitates filling of the filler 45 and/or the white pigment 47 at sites of the cover member 42 located directly under the light emitting elements 31. Multi-stage stud bumps can be formed relatively easily by using a wire bonding machine.

As shown in FIG. 3A, in Embodiment 3, a support base 12 is a board jig. This board jig includes a hard board, and preferably a variety of sheets (including films) are provided over this board.

As shown in FIG. 3a, the light emitting elements 31 in Embodiment 3 are in the form of a wafer that has not yet been separated into individual units. This wafer has a plurality of light emitting element regions that are two-dimensionally contiguous, and the light emitting elements 31 can be viewed as at least one of these light emitting element regions. Lattice-like grooves are provided to the mounting-side main surface of the wafer, and the light emitting elements regions are divided up by these grooves.

Figure 3B:
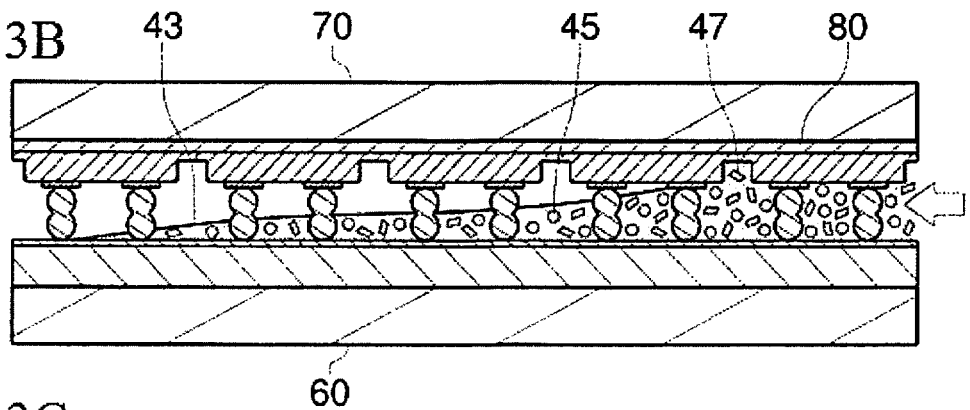
Figure 3C:
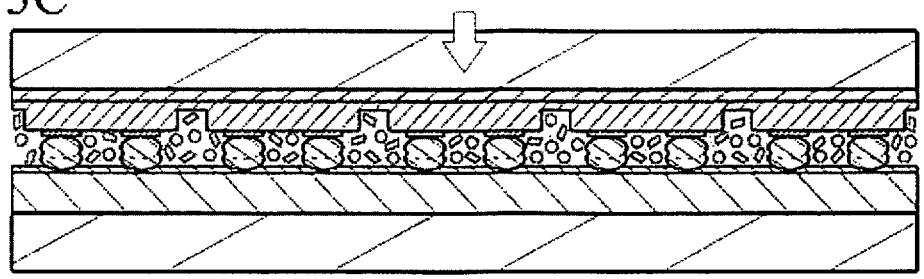

As shown in FIGS. 3B and 3C, in Embodiment 3, in the second step, the cushioning member 80 is provided between the light emitting elements 31 and the upper molding die 70. The cushioning member 80 may be provided between the lower molding die 60 and the support base 12, or may be provided both between the upper molding die 70 and the light emitting elements 31, and between the lower molding die 60 and the support base 12. The cushioning member 80 reduces or prevents damage to the support base 12 and/or the light emitting elements 31 by the mold.

As shown in FIGS. 3B and 3C, in Embodiment 3, in the second step, after the compound 43 of the cover member has been injected into the mold cavity between the lower molding die 60 and the upper molding die 70, the bumps 21 are plastically deformed by pressing the light emitting elements 31 and the support base 12 with the lower molding die 60 and the upper molding die 70. This allows the compound 43 of the cover member to be injected the directly spaces under the light emitting elements 31 in a state in which there is a relatively large gap between the upper surface of the support base 12 and the lower surface of the light emitting elements 31. It is therefore easier to fill the filler 45 and/or the white pigment 47 into sites of the cover member 42 located the directly spaces under the light emitting elements 31.

As shown in FIGS. 3B and 3C, in Embodiment 3, in the second step, because grooves are provided to the mounting-side main surface of the wafer, the compound 43 of the cover member goes into these grooves, allowing part of the side surfaces of the light emitting elements 31 (and particularly the side surfaces of the semiconductor laminate) to be covered by the cover member 42.

Figure 3D:
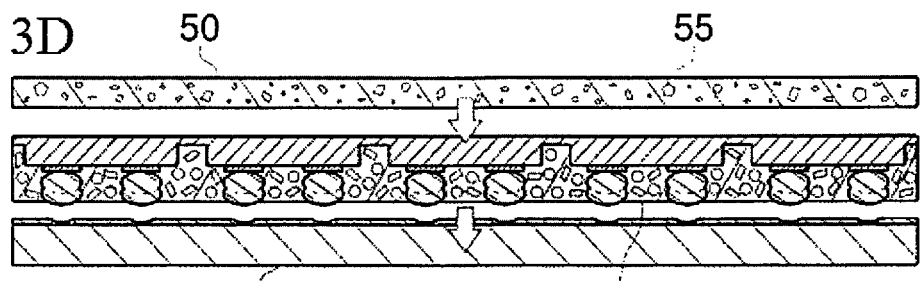
Figure 3E:
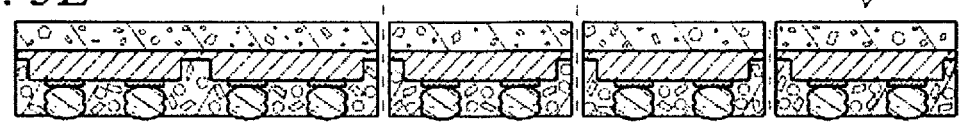

As shown in FIGS. 3C and 3D, in Embodiment 3, in the second step, during the pressing of the support base 12 and the light emitting elements 31 by the lower molding die 60 and the upper molding die 70, part of the bumps 21 may push into the sheet of the support base 12. When this happens, the portions where the bumps 21 have pushed into the sheet are more readily exposed from the cover member 42, so it is easier to form external connection terminals of the light emitting device 300 with the bumps 21. Furthermore, the external connection terminals can be formed so that they are spread out over the lower surface of the light emitting device 300 by providing a metal foil to the sites where the bumps 21 are provided on the support base 12.

As shown in FIG. 3D, in Embodiment 3, there is a fourth step of separating the support base 12 from a composite that includes the light emitting elements 31, the bumps 21, and the cover member 42 after the second step. This allows a CSP type-light emitting device to be manufactured in which the lower surface of the cover member 42 serves as the mounting-side main surface. Also, the lower surface of the composite (the surface touching the support base 12) may be polished after the fourth step.

In the second step, in the plastic deformation of the bumps 21 by clamping and pressing the light emitting elements 31 and the support base 12 with the lower molding die 60 and the upper molding die 70, this pressing force can be utilized to bond a light-transparent member to the upper surfaces of the light emitting elements 31. By this simple method, the same mold can be used not only to form the cover member 42 and adjust the orientation of the light emitting elements 31, but also to bond a light-transparent member to the light emitting elements 31. The light-transparent member used here can be the same one as the light-transparent member 50, or it can be a sintered of a ceramic (such as alumina) and a phosphor, or the like. Examples of bonding methods include hot compression bonding and surface activated bonding (room temperature bonding). For instance, among FIGS. 3A to 3E, it is conceivable that the light-transparent member 50 shown in FIG. 3D will be disposed at (moved to) the position of the cushioning member 80 shown in FIGS. 3B and 3C.

The various constituent elements of the light emitting device of the present invention and its method of manufacture will now be described.

Support Bases 10, 11, and 12

The support base serves as a base for supporting the light emitting elements at the time of at least the light emitting device manufacturing. The semiconductor element mounting surface of the support base is preferably flat. The support base is mainly a wiring board, a lead frame, or a board jig.

Wiring Board

The wiring board has wiring that is electrically connected to the light emitting elements, and a base body that supports this wiring. There are no particular restrictions on the thickness (total thickness) of the wiring board, but it is at least 0.03 mm and no more than 2 mm, for example, with at least 0.05 mm and no more than 1 mm being preferable, and at least 0.05 mm and no more than 0.5 mm being even better. When the wiring board is a rigid board, the base body of the wiring board can be made from ceramic, glass, metal, resin (including fiber reinforced resin), paper, or the like. Examples of ceramics include aluminum oxide, aluminum nitride, zirconium oxide, zirconium nitride, titanium oxide, titanium nitride, and mixtures of these. Examples of metals include copper, iron, nickel, chromium, aluminum, silver, gold, titanium, and alloys of these. Examples of resins include epoxy, glass epoxy, BT resin, and polyimide. When the wiring board is a flexible board, examples of materials of the base body of the wiring board include polyimide, polyethylene terephthalate, polyethylene naphthalate, liquid crystal polymers, and cycloolefin polymers. It will be easier to use an inexpensive resin, or a metal with good heat dissipation, as the base body of the wiring board with a stress absorption structure that combines bumps with a cover member.

Wiring 15

The wiring is formed on at least the upper surface of the base body as a foil or film, and may also be formed on the lower surface and/or in the interior of the base body. Also, the wiring preferably includes lands (die pads) to which the light emitting elements are bonded, external connection terminals, and extension wiring that connects these. The wiring can be formed, for example, from copper, iron, nickel, tungsten, chromium, aluminum, silver, gold, titanium, palladium, rhodium, and alloys of these. These metals or alloys may be a single layer or multilayer. It is particularly preferable from the standpoint of heat dissipation to use copper or a copper alloy. Also, silver, platinum, aluminum, rhodium, gold, tin, copper, alloys of these, or other such plating or light reflecting films may be provided, of which silver and silver alloys are preferable because of their light reflectivity. This wiring can be formed by electroplating, electroless plating, sputtering, vapor deposition, printing, painting, co-firing, post-firing, or another such method.

Lead Frame

The lead frame is the product of subjecting a metal plate made of copper, aluminum, gold, silver, tungsten, iron, nickel, cobalt, molybdenum, an alloy of these, phosphor bronze, copper-iron alloys, or the like to stamping, etching, rolling, or various other kinds of machining. The lead frame may be made of a laminate of these metals, but it is simpler just to have it be a single layer. A copper alloy whose main component is copper is particularly favorable. The surface layer thereof may be plated with silver, aluminum, rhodium, gold, copper, an alloy of these, or the like, or with a light reflecting film, and silver is particularly favorable because of its good light reflectivity. There are no particular restrictions on the thickness (total thickness) of the lead frame, but it is at least 0.1 mm and no more than 1 mm, for example, with at least 0.2 mm and no more than 0.4 mm being preferable.

Board Jig

The plate of the board jig can be made from the same material as the above-mentioned rigid board. The sheet can be a pressure-sensitive adhesive sheet, a protective sheet, a mold release sheet, or the like.

Bumps 20 and 21

The bumps are protrusions composed of metal or an alloy. The bumps can be ball bumps, stud bumps, plating bumps, or printing bumps, as well as columnar protrusions that are called pillars. There are no particular restrictions on the diameter of the bumps right after they are formed (before they are plastically deformed), and it may be suitably selected taking account of heat dissipation from the light emitting elements and lateral contact after plastic deformation due to bump pitch. There are no particular restrictions on the thickness (height) of the bumps immediately after they are formed (before they are plastically deformed), and while thicker (taller) is better from the standpoint of the thermal shock resistance of the bump bonding, thinner (shorter) is better from the standpoint of heat dissipation from the light emitting elements, so the bump may be suitably selected according to the (intended application of the) light emitting device.

Light Emitting Elements 30 and 31

The light emitting element at least has a semiconductor element structure, and usually also comprises a substrate. An LED chip is an example of a light emitting element. The top view shape of the light emitting element is preferably quadrangular, and particularly a square shape or a rectangular shape that is longer in one direction, but other shapes are also possible. The side surfaces of the light emitting element (mainly the substrate) may be perpendicular to the upper surface, or may be inclined inward or outward. The light emitting element has positive and negative (p and n) electrodes on the same surface side, and is flip-chip mounted (surface down). One or more light emitting elements may be installed in a single light emitting device. A plurality of light emitting elements can be connected in series or in parallel. The semiconductor element structure preferably includes a laminate of a semiconductor layer, that is, at least an n-type semiconductor layer and a p-type semiconductor layer, with an active layer interposed in between them. The semiconductor element structure may include electrodes and/or an insulating film. The electrodes can be made from gold, silver, tin, platinum, rhodium, titanium, aluminum, tungsten, palladium, nickel, or alloys of these. The insulating film can be made from an oxide or nitride of one or more elements selected from the group including of silicon, titanium, zirconium, niobium, tantalum, and aluminum. The emission wavelength of the light emitting element can be selected from the ultraviolet band to the infrared band, depending on the semiconductor material and the mixed crystal ratio thereof. It is preferable to use as the semiconductor material a nitride semiconductor that is capable of emitting light of a short wavelength that can efficiently excite a phosphor (and mainly one expressed by the general formula $In_xAl_yGa_{1-x-y}N$ ($0 \leq x$, $0 \leq y$, $x+y \leq 1$). From the standpoints of deterioration of the resin members, complementary color relationship with the light emitted by the phosphor, and so forth, the emission wavelength of the light emitting element is preferably at least 400 nm and no more than 530 nm, with at least 420 nm and no more than 490 nm being even better. Also, from the standpoints of emission efficiency and excitation of the phosphor, a range of at least 450 nm to no more than 475 nm is preferable. In addition, it is also possible to use an InAlGaAs semiconductor, an InAlGaP semiconductor, zinc sulfide, zinc selenide, silicon carbide, or the like. The substrate of the light emitting element is mainly a crystal growth substrate capable of growing crystals of the semiconductor constituting the semiconductor element structure, but may also be a bonding substrate for bonding to a semiconductor element structure separated from a crystal growth substrate. In the case where the substrate is light-transparent, it will be easier to perform flip-chip mounting, and the light extraction efficiency will also tend to be higher. Examples of substrate materials include sapphire, spinel, gallium nitride, aluminum nitride, silicon, silicon carbide, gallium arsenide, gallium phosphide, indium phosphide, zinc sulfide, zinc oxide, zinc selenide, and diamond. The thickness of the substrate is at least 0.02 mm and no more than 1 mm, for example, and at least 0.05 mm and no more than 0.5 mm are preferable from the standpoint of the strength of the substrate and the thickness of the light emitting device.

Cover Members 40, 41, and 42, and Compound 43 of Cover Member

The cover member may be called "underfill," "mold underfill," or the like, for example. The cover member (and particularly at sites located directly under the light emitting elements) also functions an adhesive agent that assists in the bonding of the bumps to the wiring or lead frame. The cover member is in a state of being fluid prior to solidification; that is, it is in the form of a liquid (including a sol or slurry form). The base material of the cover member can be a thermosetting resin, a thermoplastic resin, or glass. Examples of thermosetting resins include epoxy resin, silicone resin, polyimide resin, polyurethane resin, polybismaleimide triazine resin, unsaturated polyester, diallyl phthalate resin, modified versions of these resins, and hybrids of these resins. Examples of thermoplastic resins include alicyclic polyamide resin, semiaromatic polyamide resin, polyethylene terephthalate, polycyclohexane terephthalate, liquid crystal polymers, polycarbonate resin, syndiotactic polystyrene, polyphenylene ether, polyphenylene sulfide, polyether sulfone resin, polyether ketone resin, polyarylate resin, modified versions of these resins, and hybrids of these resins. Of these, silicone resins and modified or hybrid silicone resins are preferred because they have good resistance to heat and light and they do not undergo much volumetric shrinkage after curing.

Filler 45

The filler may be an organic material, but an inorganic material is preferable from the standpoint of a lower coefficient of thermal expansion. Examples of fillers include silica, glass, wollastonite (calcium silicate), mica, talc, potassium titanate, and aluminum oxide. The filler may be a single one of these types, or a combination of two or more types can be used. There are no particular restrictions on the form of the filler, which may be indefinite form (crushed), but a spherical form is preferable from the standpoint of fluidity. Also, a filler that functions as a reinforcing agent is preferably in the form of fibers or plates (flakes).

White Pigment 47

Examples of the white pigment include titanium oxide, zinc oxide, magnesium oxide, magnesium carbonate, magnesium hydroxide, calcium carbonate, calcium hydroxide, calcium silicate, magnesium silicate, barium titanate, barium sulfate, aluminum hydroxide, aluminum oxide and zirconium oxide, the white pigment can be used singly of these, or in combination of two or more of them. The white pigment is different from the above-mentioned filler basically, but the hollow particles of the above-mentioned filler can be used supplementary. There are no particular restrictions on the shape of the white pigment, and it may be indefinite form (crushed), but a spherical form is preferable from the standpoint of molding fluidity.

Light-Transparent Members 50 and 51, Compound 53 of Light-Transparent Member

The light-transparent member may be a member that is electrically insulating and that is light-transparent to the light emitted by the light emitting element (preferably a light transmittance of 450 nm is at least 70% T, and more preferably at least 85% T). Examples of the base material of the light-transparent member include silicone resin, epoxy resin, phenol resin, polycarbonate resin, acrylic resin, TPX resin, polynorbornene resin, modified versions of these resins, and hybrids of these resins. It may be a glass. Among them, silicone resin, or a modified or hybrid silicone resin, is preferable because of its good resistance to heat and light and because it will not undergo much volumetric shrinkage after curing. The light-transparent member preferably contains a phosphor and/or a filler (the same as discussed above) or the like, but this is optional.

Phosphor 55

The phosphor absorbs at least some of the primary light emitted from the light emitting element, and emits secondary light whose wavelength differs form that of the primary light. More specifically, examples include cerium-activated yttrium-aluminum-garnet, europium- and/or chromium-activated calcium silicate, europium-activated SiAlON, europium-activated silicate, and manganese-activated calcium fluorosilicate. The phosphor may also be quantum dots. Quantum dots are particles with a size of at least 1 nm and no more than 100 nm, and the emission wavelength can be varied by changing the particle size. Examples of quantum dots include cadmium selenide, cadmium telluride, zinc sulfide, cadmium sulfide, lead sulfide, lead selenide, and mercury cadmium telluride. The phosphor can be just one of these, or a combination of two or more types can be used. This results in a light emitting device that emits a mixed light (such as white light) of primary light and secondary light of a visible wavelength, or in a light emitting device that emits secondary light of a visible wavelength upon excitation by ultraviolet light (primary light).

Lower Molding Die 60 and Upper Molding Dies 70 and 71

The mold (lower molding die and upper molding die) can be any one that combines the function of a mold used in transfer molding, injection molding, compression molding, and other such molding machines, with the function of a mold used in a press-bonding machine (capable of at least pressurization, and preferably capable of applying ultrasonic waves and/or heating).

Cushioning Member 80

The cushioning member cushions the impact of the molding die on the light emitting elements or the support base, and prevents damage that would otherwise be caused by direct contact of the molding die with the light emitting elements or the support base. However, the use of a cushioning member is optional, and not essential. The cushioning member can be a pressure-sensitive adhesive sheet, a protective sheet, a mold release sheet, an elastic sheet, or the like.

INDUSTRIAL APPLICABILITY

The light emitting device of the present invention can be used for backlight light sources of liquid crystal displays, various kinds of lighting fixtures, and various kinds of display devices such as large displays, advertisements and destination guides, and image reading devices in digital video cameras, facsimiles, copiers, scanners and the like, and projector devices.

What is claimed is:

1. A method for manufacturing a light emitting device, comprising:
   a first step of mounting a light emitting element on a support base with a bump; and
   a second step of clamping the support base and the light emitting element and pressing between a lower molding die and an upper molding die to plastically deform the bump, and injecting a compound of a cover member into a mold cavity between the lower molding die and the upper molding die and curing the compound to form the cover member that covers at least a lower surface of the tight emitting element after the first step.

2. A method for manufacturing a light emitting device, comprising:
   a first step of mounting a plurality of light emitting elements on a support base with bumps; and
   a second step of clamping the support base and the plurality of light emitting elements and pressing between a lower molding die and an upper molding die to plastically deform at least one of the bumps, and injecting a compound of a cover member into a mold cavity between the lower molding die and the upper molding die and curing the compound to form the cover member that covers at least a lower surface of the light emitting element after the first step.

3. The method for manufacturing a light emitting device according to claim 2, wherein the second step includes clamping the support base and the plurality of light emitting elements and pressing between the lower molding die and the upper molding die so as to satisfy $t_C \geq 5$ μm $(t_D+6\sigma)+t_S+t_B$, in which $t_S$ represents thickness of the support base, $t_B$ represents thickness of a cushioning member when the cushioning member is provided between the lower molding die and the support base and/or between the upper molding die and the light emitting elements, $t_D$ represents average thickness of the plurality of light emitting elements, σ a represents standard deviation of thickness of the plurality of light emitting elements, and $t_C$ represents spacing between the upper molding die and the lower molding die at sites where the plurality of light emitting elements are clamped.

4. The method for manufacturing a light emitting device according to claim 2, wherein the upper molding die has a convex portion located directly over the light emitting element, the second step includes forming a first recess portion that has on its bottom surface a upper surface of the light emitting element on the cover member by the convex portion, and further comprising a third step of forming a light-transparent member within the first recess portion.

5. The method for manufacturing a light emitting device according to claim 4, wherein the convex portion is provided directly over the plurality of light emitting elements, and the second step includes forming the first recess portion that has on its bottom surface the upper surface of the plurality of light emitting elements on the cover member by the convex portion.

6. The method for manufacturing a light emitting device according to claim 2, wherein the upper molding die has divider portions that surround a specific number of the plurality of light emitting elements, and the second step includes forming a second recess portion that surrounds the specific number of light emitting elements on the cover member by the divider portion.

7. The method for manufacturing a light emitting device according to claim 1, wherein, in the first step, the bump is configured as a multi-stage stud bump.

8. The method for manufacturing a light emitting device according to claim 1, wherein, in the first step, the bump is made by gold, silver, copper, tin, platinum, zinc, nickel, and alloys thereof.

9. The method for manufacturing a light emitting device according to claim 1, wherein, in the second step, the compound of the cover member contains an inorganic filler and a white pigment.

10. The method for manufacturing a light emitting device according to claim 9, wherein the inorganic filler is silica, and the white pigment is titanium oxide.

11. The method for manufacturing a light emitting device according to claim 1, wherein the support base is a wiring board that has a wiring or a lead frame, and the first step or the second step includes clamping the support base and the light emitting element and between the lower molding die and the upper molding die, and pressing the lower molding die and the upper molding die to bond the light emitting element to the wiring or the lead frame with the bump.

12. The method for manufacturing a light emitting device according to claim 1, further comprising a fourth step of separating the support base from a composite that includes the light emitting elements, the bump and the cover member after the second step.

13. The method for manufacturing a light emitting device according to claim 2, wherein, in the first step, each of the bumps is configured as a multi-stage stud bump.

14. The method for manufacturing a light emitting device according to claim 2, wherein, in the first step, the bumps are made by gold, silver, copper, tin, platinum, zinc, nickel, and alloys thereof.

15. The method for manufacturing a light emitting device according to claim 2, wherein, in the second step, the compound of the cover member contains an inorganic filler and a white pigment.

16. The method for manufacturing a light emitting device according to claim 15, wherein the inorganic filler is silica, and the white pigment is titanium oxide.

17. The method for manufacturing a light emitting device according to claim 2, wherein the support base is a wiring board that has a wiring or a lead frame, and the first step or the second step includes clamping the support base and the light emitting element and between the lower molding die and the upper molding die, and pressing the lower molding die and the upper molding die to bond the light emitting element to the wiring or the lead frame with the bumps.

18. The method for manufacturing a light emitting device according to claim 2, further comprising a fourth step of separating the support base from a composite that includes the light emitting elements, the bumps and the cover member after the second step.

19. The method for manufacturing a light emitting device according to claim 1, wherein the upper molding die has a convex portion located directly over the light emitting element, the second step includes forming a first recess portion that has on its bottom surface a upper surface of the light emitting element on the cover member by the convex portion, and further comprising a third step of forming a light-transparent member within the first recess portion.

20. The method for manufacturing a light emitting device according to claim 3, wherein the upper molding die has divider portions that surround a specific number of the plurality of light emitting elements, and the second step includes forming a second recess portion that surrounds the specific number of light emitting elements on the cover member by the divider portion.

* * * * *